(12) United States Patent
Chism II (10) Patent No.: US 7,122,806 B2
(45) Date of Patent: Oct. 17, 2006

(54) LASER STIMULATED ATOM PROBE CHARACTERIZATION OF SEMICONDUCTOR AND DIELECTRIC STRUCTURES

(76) Inventor: William W. Chism II, 2100 Newfield La., Austin, TX (US) 78703

( * ) Notice: Subject to any disclaimer, the term of this patent is extended or adjusted under 35 U.S.C. 154(b) by 0 days.

(21) Appl. No.: 10/882,110

(22) Filed: Jun. 30, 2004

(65) Prior Publication Data
US 2005/0017174 A1 Jan. 27, 2005

Related U.S. Application Data

(60) Provisional application No. 60/492,939, filed on Aug. 6, 2003, provisional application No. 60/485,262, filed on Jul. 3, 2003.

(51) Int. Cl.
*H01J 21/00* (2006.01)
*H01J 21/24* (2006.01)
(52) U.S. Cl. .............................. 250/423 P; 250/423 R
(58) Field of Classification Search ............. 250/423 P
See application file for complete search history.

(56) References Cited

U.S. PATENT DOCUMENTS

| | | | |
|---|---|---|---|
| 5,061,850 A | 10/1991 | Kelly et al. | |
| 5,347,132 A | 9/1994 | Holzman et al. | |
| 5,440,124 A | 8/1995 | Kelly et al. | |

FOREIGN PATENT DOCUMENTS

EP 0231247 B1 10/1990
WO WO 87/00682 A1 1/1987

OTHER PUBLICATIONS

Kellogg, G. L., "Pulsed-laser atom probe mass spectroscopy," 1987, J. Phys. E: Sci. Instrum., 20, pp. 125-136.*
Cerezo et al., "Application of a position-sensitive detector to atom probe microanalysis," Rev. Sci. Instrum. 59:6, 862-866, Jun. 1988.
Cerezo et al., "Performance of an energy-compensated three-dimensional atom probe," Rev. Sci. Instrum. 69:1, 49-58, Jan. 1998.
Forbes, "Field evaporation theory: a review of basic ideas," Applied Surface Science 87/88, 1-11, 1995.
Keldysh, "The effect of a strong electric field on the optical properties of insulating crystals," Soviet Physics JETP, 34:7, 5, 788-790, Nov. 1958.
Kellogg et al., "Pulsed-laser atom-probe field-ion microscopy," J. App. Phys. 51:2, 1184-1193, Feb. 1980.
King et al., "Atom probe analysis and field emission studies of silicon," J. Vac. Sci. Techno. B 12:2, 705-709, Mar./Apr. 1994.

(Continued)

*Primary Examiner*—David A. Vanore
(74) *Attorney, Agent, or Firm*—Vinson & Elkins L.L.P.

(57) ABSTRACT

A laser stimulated atom probe for atom probe imaging of dielectric and low conductivity semiconductor materials is disclosed. The laser stimulated atom probe comprises a conventional atom probe providing a field emission tip and ion detector arrangement, a laser system providing a laser short laser pulse and synchronous electronic timing signal to the atom probe, and an optical system for delivery of the laser beam onto the field emitting tip apex. Due to enhanced absorption, it is also possible to realize a photo ionization mechanism, wherein the laser stimulates electronic transitions from the more extended surface atoms, thereby ionizing the surface atom.

27 Claims, 6 Drawing Sheets

OTHER PUBLICATIONS

Liu et al., "Numerical calculation of the temperature evolution and profile of the field ion emitter in the pulsed-laser time-of-flight atom probe," Rev. Sci. Instrum., 55:11, 1779-1784, Nov. 1984.

Liu et al., "Numerical calculation of the temperature distribution and evolution of the field-ion emitter under pulsed and continuous-wave laser irradiation," J. Appl. Phys., 59:4, 1334-1340, Feb. 1986.

Nishikawa et al., "Development of a scanning atom probe," J. Vac. Sci. Technol. B 13:2, 599-602, Mar./Apr. 1995.

Tsong et al., "Energy distributions of pulsed-laser field-desorbed gaseous ions and field-evaporated metal ions: A direct time-of-flight measurement," Phys. Rev. B, 29:2, 529-542, Jan. 15, 1984.

Tsong, "Field ion image formation," Surface Science 70, 211-233, 1978.

Tsong et al., "Photon stimulated field ionization," The Journal of Chemical Physics, 65:6, 2469-2470, Sep. 15, 1976.

Tsong et al., "Pulsed-laser time-of-flight atom-probe field ion microscope," Rev. Sci. Instrum., 53:9, 1442-1448, Sep. 1982.

* cited by examiner

LASER STIMULATED ATOM PROBE CHARACTERIZATION OF SEMICONDUCTOR AND DIELECTRIC STRUCTURES

CROSS-REFERENCE TO RELATED APPLICATIONS

The present application claims benefit of U.S. Provisional Patent Application Ser. No. 60/485,262 filed on Jul. 3, 2003 and U.S. Provisional Patent Application No. 60/492,939, filed Aug. 6, 2003.

FIELD OF THE INVENTION

The present disclosure relates generally to atom probe microscopy and more particularly to laser stimulated atom probe imaging of semiconductor and dielectric materials.

BACKGROUND OF THE INVENTION

Atom probe microscopes provide atomic scale structural resolution and species analysis of material surfaces. The atom probe consists of a field ion microscope used in conjunction with a time of flight mass spectrometer. Atom probes provide an atom by atom decomposition of a sharp sample "tip," of approximately 100 nanometers in diameter. A positive voltage is applied across the sharp tip apex, to an electrode, resulting in a very strong electric field at the surface of the tip. Atoms at the surface of the tip become extended and evaporate from the surface through a physical process known as "field evaporation." This process produces an ion near the tip which then travels toward the negative electrode. The onset of field evaporation occurs at electric fields on the order of 1–5 volts per angstrom (V/A) for all known materials (Miller, 1989). Near the field evaporation threshold, if the field is increased by a few percent, for example 20%, the field evaporation rate increases by several orders of magnitude. By pulsing the tip apex field during a short time interval, typically several nanoseconds, field evaporation is activated during a short time window. Time of flight mass spectroscopy is then performed on the evaporated atoms, thereby determining the atomic species. The width of the voltage pulse may limit the mass resolution of the atom probe (Tsong, 1982; Kellogg, 1980). The three dimensional atom probe (3DAP), or imaging atom probe, is an atom probe wherein i) the x-y position of the ion at the tip surface is mapped by projection of the field evaporated ion onto a position sensitive detector such as a microchannel plate detector or wedge and strip anode (Cerezo, 1988; Holzman, 1994), ii) the "z" position of the ion is determined by the sequence of the field evaporation event and the evaporation rate as in typical atom probes, and iii) the ion mass resolution is again provided by time of flight mass spectrometry of the ion. The application of atom probe techniques to metals and high conductivity semiconductor materials has been discussed extensively in the literature (Cerezo, 1998; King, 1994; Miller, 1989; Tsong, 1984). Further improvements in atom probe microanalysis have been facilitated by the addition of a funnel-shaped extraction electrode placed near the tip (Nishikawa, et al, 1995; Kelly, 1995). This allows atom probe analysis of individual tips in a field of tips and scanning of the atom probe over larger areas.

The main problem with conventional electrically pulsed atom probes is that they cannot be used to investigate samples with resistivity greater than approximately 10 Ohm-centimeter. As noted, the field evaporation mechanism required for atom probe operation will occur at electric fields on the order of several volts per angstrom for all materials—metals, semiconductors, or dielectrics. However, dielectrics and common semiconductors do not possess the conductivity required to support the short voltage pulsing needed to attain acceptable time of flight resolution, thus the atomic species cannot be resolved for dielectrics and common semiconductors using conventional voltage pulsed atom probes. For this reason conventional voltage pulsed atom probes are limited to "high-conductivity" applications such as metals or low resistivity semiconductor materials. Electrically pulsed atom probes also typically encounter difficulty in operation on samples of resistivity approximately 1 Ohm-centimeter or greater. For n-type silicon, 1 Ohm-centimeter resistivity corresponds to a dopant concentration of approximately $5 \times 10^{15}$ atoms per cubic centimeter, while 10 Ohm-centimeter resistivity corresponds to a dopant concentration of approximately $5 \times 10^{14}$ atoms per cubic centimeter. Thus, atom probe imaging of silicon samples with dopant levels below $5 \times 10^{15}$ atoms per cubic centimeter ($cm^3$) becomes difficult, and imaging of silicon samples with dopant levels below $5 \times 10^{14}$ atoms per $cm^3$ is impossible. This "conductivity limit" is the principle impediment to the application of atom probe techniques to the dielectric and semiconductor materials commonly used in microelectronic and optoelectronic devices.

The inability to transmit short, high voltage pulses through semiconductor and dielectric tips has been overcome in a number of experiments by using laser pulsing to deposit thermal energy into the tip, thereby activating the field evaporation mechanism through an increase in temperature (King et al., 1994; Tsong et al., 1982). However, a substantial problem with conventional pulsed laser atom probes is that they fail to use an ultraviolet (UV) or visible wavelength laser wherein efficient thermal pumping of field evaporation in semiconductor materials is attained. Generally, optical absorption in semiconductor materials is peaked toward the ultraviolet. Thus, the efficiency of thermal pulsing of semiconductor and dielectric materials is improved by using UV laser wavelengths where the optical absorption is strong. However, prior studies of thermally pumped field evaporation in semiconductors have utilized laser wavelengths in the near-infrared, where the optical absorption is weak (King, 1995). Another problem with conventional electrically pulsed atom probes is that the use of high voltage pulsing on low conductivity samples induces ion energy dispersion (Cerezo, 1998) and tip mechanical stress failure. The pulsed laser approach also minimizes energy dispersion and mechanical stress. Thus, the pulsed laser atom probe also has advantages with respect to mass resolution and reliability. Also, although there have been a number of pulsed laser atom probe studies on metals (Kellogg, 1980), no significant advantage is conferred by using a pulsed laser on metal samples since metals may be analyzed using the conventional voltage pulsed atom probe technique.

An additional problem with conventional pulsed laser atom probes is they fail to utilize a laser wavelength located near an optical absorption edge. In this case the optical absorption coefficient will depend strongly on the static field, as the absorption coefficient undergoes a substantial redshift in strong electric fields (Keldysh, 1958). Thus, the optical absorption coefficient may be enhanced through an electric field induced redshift of the optical absorption, provided the laser wavelength is chosen nearby to strong absorption features. This dependence of the optical absorption on electric field has never been utilized in the prior art pulsed laser atom probe technique.

However, despite the aforementioned deficiencies in the prior art, the most significant problem with the conventional pulsed laser atom probe technique is that it does not utilize photo-ionization for atom probe imaging of semiconductor and dielectric materials. The ability to directly photo-ionize atoms from the surface of an emission tip provides a major advance in the atom probe microanalysis technique. For example, photo-ionization allows the accurate imaging of molecular complexes such as viruses, proteins and organic molecules embedded in a sample tip. This is facilitated by the reduced distortion of surface atoms when using photo-ionization for atom probe imaging of such complexes. Although prior studies have failed to realize this photo-ionization mechanism, it is anticipated in semiconductors and dielectrics due to the much slower neutralization of surface ions than found in metals (Kellogg, 1980; Tsong, 1976).

Thus, while these devices may be suitable for the particular purpose to which they address, they are not as suitable for atom probe imaging of dielectric and low conductivity semiconductor materials. In these respects, the laser stimulated atom probe technique according to the present disclosure substantially departs from the conventional concepts and designs of the prior art, and in so doing provides a technique primarily developed for the purpose of atom probe imaging of semiconductor and dielectric materials.

SUMMARY OF THE INVENTION

In view of the foregoing disadvantages inherent in the known types of atom probes present in the prior art, the present disclosure provides a new laser stimulated atom probe technique wherein the same can be utilized for atom probe imaging of semiconductor and dielectric materials.

The laser stimulated atom probe is capable of rapidly pulsing the ion emission current from a semiconductor or dielectric tip through the use of a pulsed ultraviolet (UV) laser. The optical absorption in semiconductor or dielectric materials is generally enhanced in the UV. This increased optical absorption provides efficient thermal pumping of the field evaporation rate. The enhanced optical absorption in the UV also allows the electric field at the tip to be reduced. Due to the enhanced absorption, a photo ionization mechanism may be realized, wherein the laser stimulates electronic transitions from the more extended surface atoms, thereby directly ionizing the surface atom. Additionally, the laser wavelength is selected nearby to strong optical absorption features such that the electric field at the tip may be used to further enhance the absorption through the Franz-Keldysh effect (Keldysh, 1958). This mechanism is available in all semiconductor and dielectric materials and provides a large enhancement of the absorption coefficient through an electric field induced redshift of the optical absorption. This mechanism further increases the efficiency of the thermal pulsing of the field evaporation rate and also amplifies the direct photo-ionization of the extended surface atoms. Thus, in the laser stimulated atom probe, the field evaporation process is supplemented by a photo-ionization mechanism. The strong optical absorption dependence on static field also has a crucial smoothing effect on surface irregularities. In these respects, the present disclosure provides a new laser stimulated atom probe technique that has many of the advantages of the conventional atom probe mentioned heretofore and many novel features that result in a new laser stimulated atom probe which is not anticipated, rendered obvious, suggested, or even implied by any of the prior art of atom probe microscopy, either alone or in any combination thereof.

To attain this, in certain embodiments, the laser stimulated atom probe generally comprises a conventional atom probe, a pulsed laser, and an optical system for delivery of the laser beam onto the sample tip apex. The atom probe may be a conventional atom probe employed in a manner similar to that used for investigation of metal sample tips. However, the tip field is held effectively static during the laser pulse. The tip apex field (F) may be used to generate ions through the conventional field evaporation mechanism, and also to redshift the optical absorption spectra of the dielectric or semiconductor material under investigation. The pulsed laser may be a commercially available, pulsed laser system operating in the UV, with mount. The laser produces a pulse of energy approximately ½ nano-Joule, with pulse width less than 1 nanosecond. The repetition rate may be varied from single shot to approximately 1 MHz. The laser system provides a synchronous trigger signal to enable recording ion time of flight in the atom probe. The laser beam is preferably collimated and directed onto the sample tip using a focusing lens arrangement. The beam diameter at focus is approximately 3–30 microns, providing a focused intensity ranging from approximately $1 \times 10^5$ Watts per square centimeter to $1 \times 10^7$ Watts per square centimeter ($W/cm^2$). The optical system consists of a number of optical elements positioned to provide for the propagation of light from the laser source, onto the sample tip apex, and finally into a laser beam stop.

There has thus been outlined, rather broadly, the more important features of preferred embodiments of the laser stimulated atom probe in order that the detailed description thereof may be better understood, and in order that the present contribution to the art may be better appreciated. There are additional features of the laser stimulated atom probe that will be described hereinafter.

In this respect, before explaining at least one embodiment of the laser stimulated atom probe in detail, it is to be understood that the laser stimulated atom probe technique is not limited in its application to the details of construction and to the arrangements of the components set forth in the following description or illustrated in the drawings. Also, it is to be understood that the phraseology and terminology employed herein are for the purpose of the description and should not be regarded as limiting. Advantages of the laser stimulated atom probe will become obvious to the reader and it is intended that these objects and advantages are within the scope of the disclosure. To the accomplishment of the above and related objects, this laser stimulated atom probe may be embodied in the form illustrated in the accompanying drawings, attention being called to the fact, however, that the drawings are illustrative only, and that changes may be made in the specific construction illustrated.

BRIEF DESCRIPTION OF THE DRAWINGS

Referring now to the drawings, objects, features and attendant advantages of the laser stimulated atom probe will become fully appreciated as the same becomes better understood when considered in conjunction with the accompanying drawings, in which like reference characters designate the same or similar parts throughout the several views.

DETAILED DESCRIPTION

The following discusses use of the laser stimulated atom probe technique for atom probe microscopy of nanometer scale silicon tip structures. It is understood that the laser stimulated atom probe technique of the present drawings may be used to analyze any semiconductor or dielectric structure, the discussion of silicon structures considered to be exemplary only and in no way limiting in scope.

Figure 1:
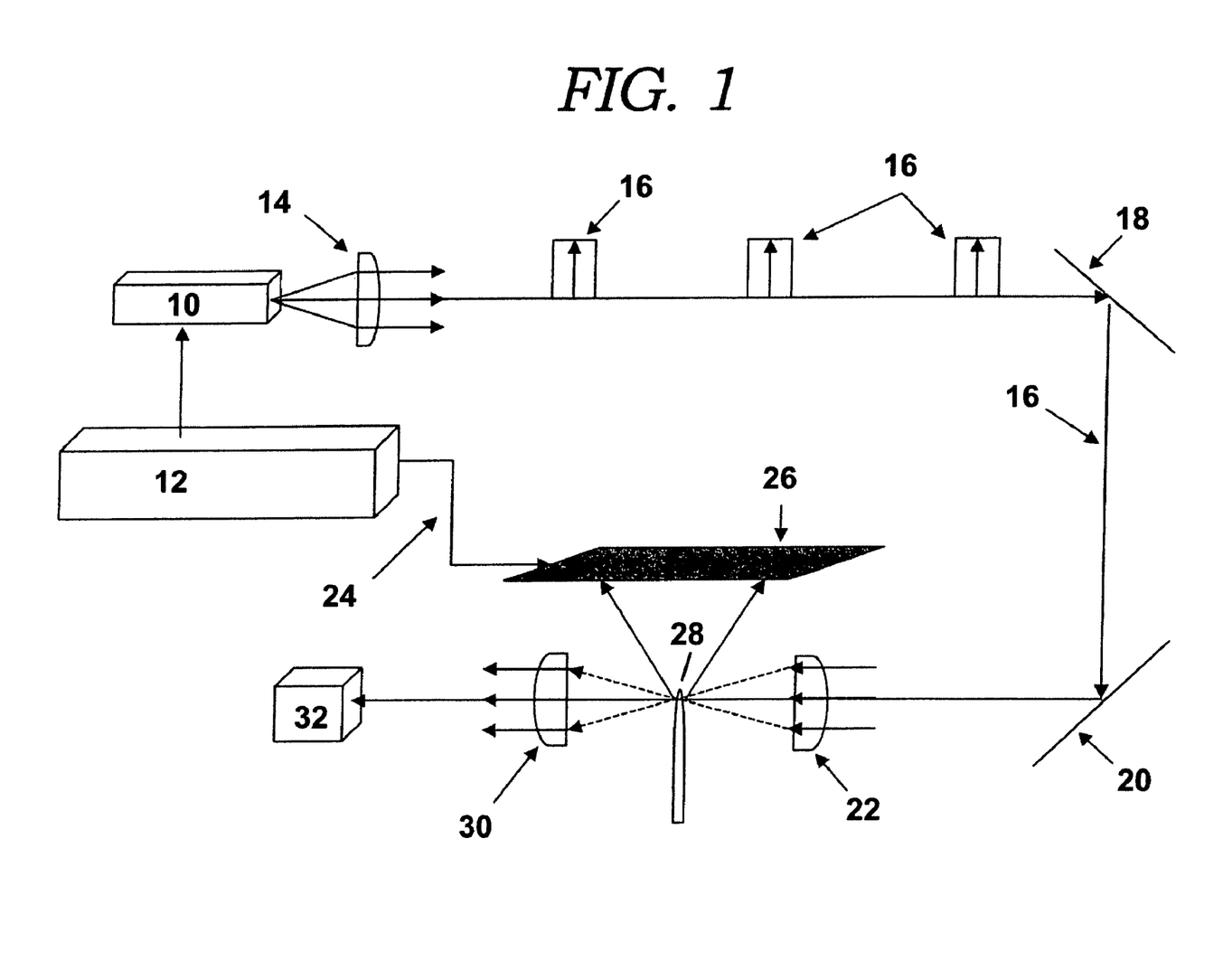
FIG. 1 contains a schematic arrangement of the laser stimulated atom probe apparatus which may be used to provide atom probe characterization of semiconductor and dielectric materials.

FIG. 1 illustrates a schematic arrangement of a laser stimulated atom probe, which utilizes a conventional atom probe providing a field emission tip and ion detector arrangement. The system shown in the drawing includes a laser 10 and laser controller 12. The laser controller directs the laser to produce short laser pulses and synchronous electronic timing signals 24 to the atom probe, which includes a position sensitive detector 26. Pulses of light 16 pass through an optical system that includes a collimation lens 14 mirrors 18, 20 and a microscope objective lens 22. The light is focused onto a field emission tip 28, through a collection lens 30 and into beam stop 32.

The atom probe may be a conventional atom probe such as a three dimensional atom probe (Cerezo, 1998) or a scanning atom probe (Nishikawa, 1995). The conventional atom probe is employed in a manner similar to that used for atom probe microscopy of high conductivity materials. However, instead of electrically pulsing the tip electric field, the field is held effectively static while the laser is pulsed to provide pulsing of the ion emission rate. The laser pulsing is accomplished in a manner similar to prior implementations of pulsed laser atom probe spectroscopy (King, 1994; Tsong, 1982; Kellogg, 1980). The laser pulses provide a trigger signal to enable recording the time of flight in the atom probe. The pulse width is approximately 800 picoseconds, with a variable repetition rate ranging from single shot up to approximately 1 MHz. The laser has a wavelength in the UV of approximately 405 nanometers, near a strong direct absorption feature in silicon located at 375 nanometers (nm). The laser source produces a pulse of energy approximately ½ nano-Joule. The laser beam is collimated by a collimation lens, reflected using dielectric mirrors, and directed onto the sample tip using a focusing lens arrangement. The focusing optic is a microscope objective lens positioned inside the atom probe evacuated chamber near to the field emitting tip apex. The focused intensity ranges from approximately $1\times10^5$ W/cm$^2$ to $1\times10^7$ W/cm$^2$. The laser beam diameter at focus is approximately 3–30 microns, thus, individual emission tips may be scanned from a field of tips illuminated by the laser pulse. The laser beam is then collected from the tip using a collection lens and directed into a beam stop. All optical elements are matched to the laser wavelength.

The laser stimulated atom probe technique makes use of a UV laser source in order to enhance the optical absorption in semiconductor or dielectric field emission tips. The increased optical absorption allows more efficient thermal pumping of the field evaporation rate. Due to the enhanced absorption, it is also possible to realize a photo ionization mechanism, wherein the laser stimulates electronic transitions from the more extended surface atoms, thereby ionizing the surface atom (Tsong, 1976). On an emission tip, the total ionization rate may be written as the sum of ionization rates due to field evaporation and photo-ionization processes. Thus the emission current for ions from the tip takes the form:

$$j = n_{FE}k_{th} + n_{PI}\alpha_{PI}I,$$

where j is the total emission current, $n_{FE}$ is the number of atoms at high probability for field evaporation, $k_{th}$ is the thermally activated field evaporation rate, $n_{PI}$ is the number of extended surface atoms which may be photo-ionized, $\alpha_{PI}$ is the optical absorption coefficient of the extended atoms, and I is the laser intensity. The first term describes field evaporation processes (Forbes, 1995), while the second term describes surface photo-ionization processes and is linearly proportional to the laser intensity. Although prior studies have failed to realize this photo-ionization mechanism, it has been anticipated in semiconductors and dielectrics due to the much slower re-neutralization of surface ions (Tsong, 1980; Tsong 1976).

Figure 2:
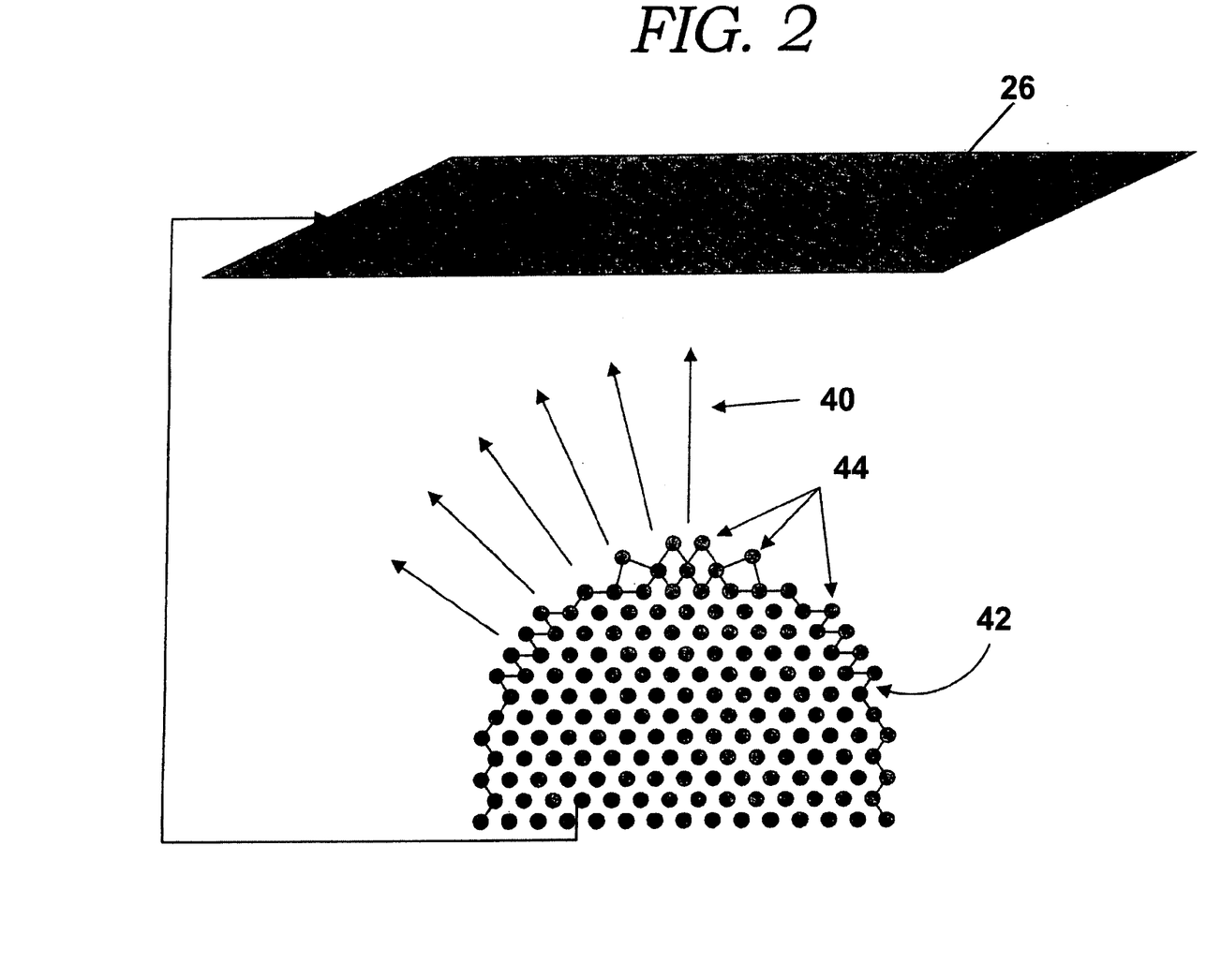
FIG. 2 illustrates a schematic semiconductor field emission tip that may be analyzed using the laser stimulated atom probe technique.

Before discussing the photo-ionization mechanism, it is useful to review the field evaporation process. In field evaporation, the number of atoms at high probability for field evaporation, $n_{FE}$, is weakly dependent of field or temperature, and is usually between 1–10% of the surface atoms. FIG. 2 shows a schematic picture of the atoms on the surface of a silicon tip under the conditions for field evaporation. When a high voltage is applied to tip, resulting in a positive constant electric field 40, atoms held by electronic bonds 42 become extended 44 from the surface. The more isolated atoms on the tip are extended preferentially, such that their evaporation is more likely. The field evaporation rate, $k_{th}$, is thermally activated and is described by an Arrhenius rate equation:

$$k_{th} = A\exp\{-Q/k_BT\},$$

where A is an empirical coefficient, Q is the field evaporation activation energy, $k_B$ is Boltzmann's constant, and T is the absolute temperature (Forbes, 1995). In typical atom probe operation, one atom is ionized for approximately every ten pulses of about 1 nanosecond length. Thus, during the voltage pulse, the field evaporation current is on the order of $1\times10^8$ ions per second. In prior experiments using thermally pumped field evaporation of silicon emitter tips (King et al., 1995), an infrared pulsed laser of wavelength 1064 nanometers was used to deposit thermal energy into the tip apex, thereby increasing the temperature to approximately 300° K, while the emitter tip apex field F was held static slightly below the field evaporation threshold. Thus the increase in temperature was used to pulse the field evaporation rate, enabling atom probe operation. In thermal laser pulsing studies, the maximum field evaporation temperature T has been found proportional to the laser pulse intensity (Liu, 1986; Liu 1984). Importantly, the field evaporation temperature T is also proportional to the bulk material absorption coefficient. The laser stimulated atom probe employs UV laser wavelengths wherein the semiconductor or dielectric material absorption is generally stronger than in the infrared. Therefore, the efficiency of thermally pumped field evaporation for semiconductors and dielectrics is increased in the laser stimulated atom probe.

Figure 3:
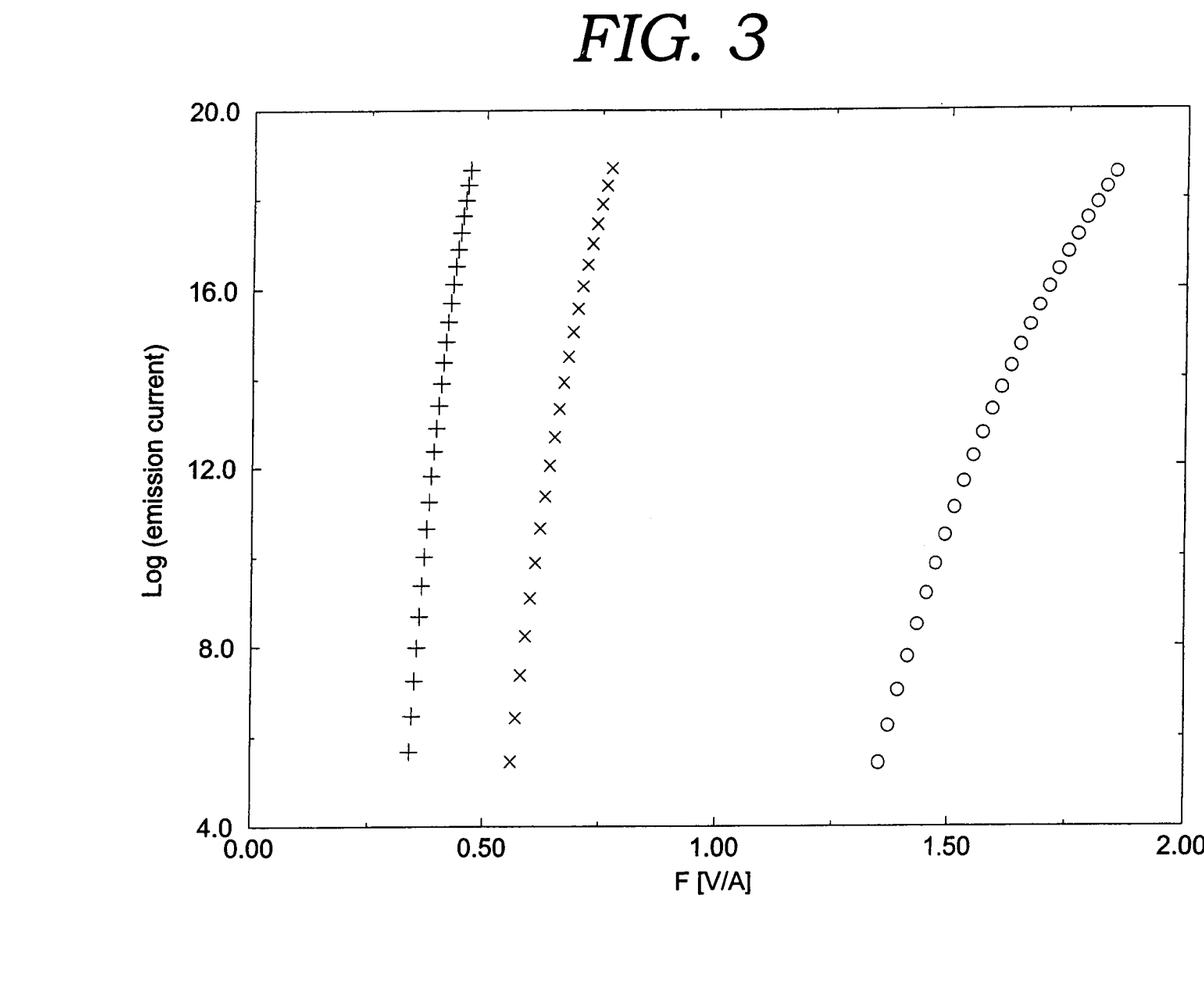
FIG. 3 contains calculated field evaporation currents from a silicon field emission tip as a function of static field, using laser irradiation of 1064 nanometer wavelength with intensity $1\times10^7$ W/cm$^2$ (open circles), and 405 nanometer wavelength with intensity $1\times10^5$ W/cm$^2$ (x). The field evaporation current at 405 nanometer wavelength with field induced redshift is also shown (+).

To quantify thermal pumping efficiency gains available in the laser stimulated atom probe technique, note the silicon absorption coefficient at 405 nm wavelength is about $8 \times 10^4$ per centimeter, whereas at 1064 nm the absorption coefficient is less than $2 \times 10^2$ per centimeter. This enhancement of the absorption coefficient by more than two orders of magnitude allows a reduction in laser intensity by the commensurate two orders of magnitude. Thus, by using a shorter wavelength wherein the semiconductor or dielectric absorption is enhanced, thermal energy is deposited more efficiently, requiring lower intensity to establish the same field evaporation temperature. To illustrate, FIG. 3 shows the improvement in field evaporation current when the 1064 nanometer laser of prior studies (open circles), operating at an intensity of $10^7$ W/cm$^2$, is replaced by a UV diode laser operating at 405 nm wavelength (x) at an intensity of $10^5$ W/cm$^2$. In FIG. 3, the field evaporation Arrhenius current is plotted as a function of static field, for irradiation of silicon by 1064 nanometer light at I=$10^7$ W/cm$^2$, using an optical absorption coefficient of $1 \times 10^2$ per centimeter. Also plotted is the Arrhenius current as a function of field for irradiation by the 405 nm laser beam at intensity I=$10^5$ W/cm$^2$, using the absorption coefficient at 405 nm of $8 \times 10^4$ per centimeter (+). The field evaporation current is seen to onset at significantly reduced fields despite the substantial reduction in laser intensity. Thus, the efficiency of thermal pulsing of semiconductor materials is improved by using laser wavelengths where the optical absorption is strong.

The shift of the onset of field ionization to lower fields can be understood as follows. Near threshold, the activation energy Q is proportional to the inverse square of the static field, as described in Forbes, 1995, pg. 7. Therefore, near threshold, the Arrhenius equation may be written:

$$j \approx n_{FE} A \exp\{-C/F^2 T\},$$

where C is a constant and F is the electric field. This shows that nearby to threshold the field ionization current may be held constant by holding the product $F^2 T$ constant. As noted, the temperature is proportional to the product of the material absorption and the transmitted intensity, i.e. $T \propto \alpha I$, where $\alpha$ is the bulk material optical absorption coefficient and I is the laser intensity. Thus, nearby to threshold the field ionization current may be held constant by holding the product $F^2 \alpha I$ constant. In FIG. 3, the Arrhenius current is plotted for irradiation of silicon by 1064 nanometer light at I=$10^7$ W/cm$^2$ and for irradiation by 405 nm light at I=$10^5$ W/cm$^2$. Again, the silicon optical absorption coefficient at 1064 nm is approximately $1 \times 10^2$ per centimeter, whereas the absorption coefficient at 405 nm is approximately $8 \times 10^4$ per centimeter. Therefore, the product $\alpha I$ is still enhanced by a factor of approximately 8 at 405 nm, despite the reduction in laser intensity. Since the product $F^2 \alpha I$ controls the Arrhenius rate, the onset of field evaporation occurs at reduced electric fields. This provides the shift of the onset of field evaporation to lower fields as seen in FIG. 3.

Figure 4:
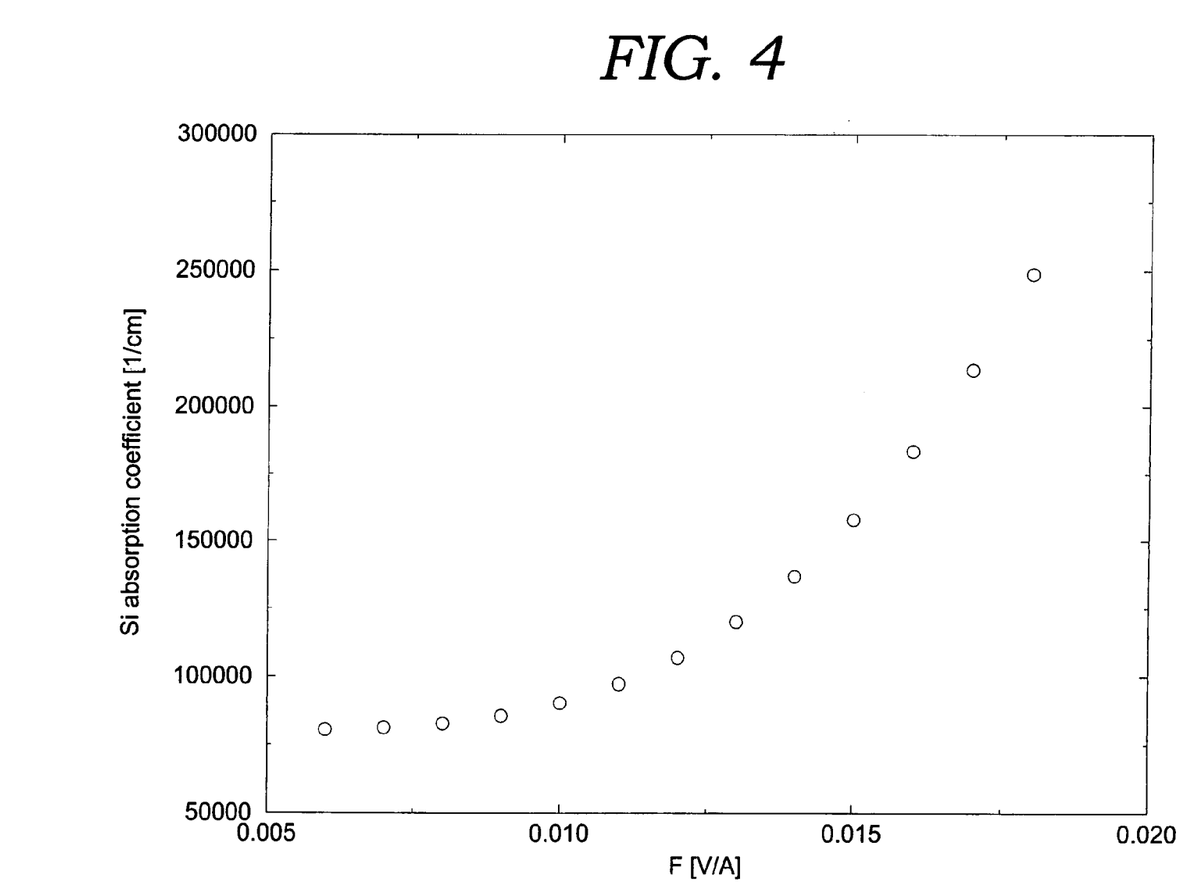
FIG. 4 is a graph of optical absorption coefficient of silicon at 405 nanometer wavelength as a function of static field.

Now, in the analysis above, field and temperature induced variations in the optical absorption have been neglected. Over the temperature range 0–500° Kelvin, the optical absorption of semiconductors and dielectrics remains essentially unchanged, broadening by a value of approximately 50 milli-electron Volts at most. Thus, the temperature dependence of the optical absorption of semiconductors and dielectrics is not of primary importance. However, nearby to strong features in the optical absorption spectra of a dielectric or semiconductor material, the field dependence of the optical absorption coefficient will be large. In particular, the optical absorption of semiconductors and dielectrics undergoes significant redshifting in strong electric fields. This effect is known as the Franz-Keldysh effect (Keldysh, 1958), and may be explained as follows. Since the strong electric field tilts the bandstructure spatially, electrons may tunnel from the valence band to the conduction band. Thus, at photon energies just below strong absorption features, the redshift of the absorption is due to photon-stimulated tunneling (Yu and Cardona, 2001). The dependence of the absorption coefficient on electric field F is given by:

$$\alpha(F) = K F^2 \exp\{-\beta/F\},$$

where K and $\beta$ are constants which depend on the "zero field" absorption, the effective electronic mass, and difference in laser wavelength from the strong absorption feature. The "zero field" absorption is the optical absorption of the material wherein no electric filed is applied. The expression above describes the redshifting of an optical absorption edge in the presence of a strong electric field (Keldysh, 1958). The 405 nanometer wavelength laser is nearby to such an absorption edge in silicon, which occurs at a wavelength of approximately 375 nanometers. In FIG. 4, the optical absorption coefficient of silicon, at 405 nm wavelength, is shown as a function of static tip field. This illustrates the field induced enhancement of the silicon absorption coefficient at 405 nanometers due to the Franz-Keldysh effect. As the static tip field increases to F≅0.02 V/Å, the silicon tip optical absorption coefficient increases from about $8 \times 10^4$ per centimeter to approximately $2.5 \times 10^5$ per centimeter. Thus, the strong field present in the laser stimulated atom probe substantially enhances the optical absorption coefficient. This provides additional enhancement in the Arrhenius field evaporation rate, also illustrated in FIG. 3. Here the field evaporation current for silicon, under 405 nm laser pulsing at $10^5$ W/cm$^2$, including the electric field enhanced silicon optical absorption, is shown. The onset of field evaporation now occurs below F=0.5 V/Å. The silicon optical coefficient is taken to be constant at $2.5 \times 10^5$ per centimeter over the static field values shown. However, the actual enhancement of the silicon optical absorption will exceed this value due to the field induced redshifting of other strong absorption features in the UV. Thus, by using a laser with wavelength just below a strong optical absorption edge, the static tip field functions to enhance the absorption coefficient through the Franz-Keldysh effect. This effect can typically be found in the UV for semiconductors and dielectrics, as such materials generally contain optical absorption edges in the UV. As also seen in FIG. 3, operation in this manner reduces the static field required for thermally pumped field evaporation. Thus, the Franz-Keldysh effect provides an additional enhancement of the field evaporation current beyond the improvement attained by using a UV laser wavelength.

Figure 5:
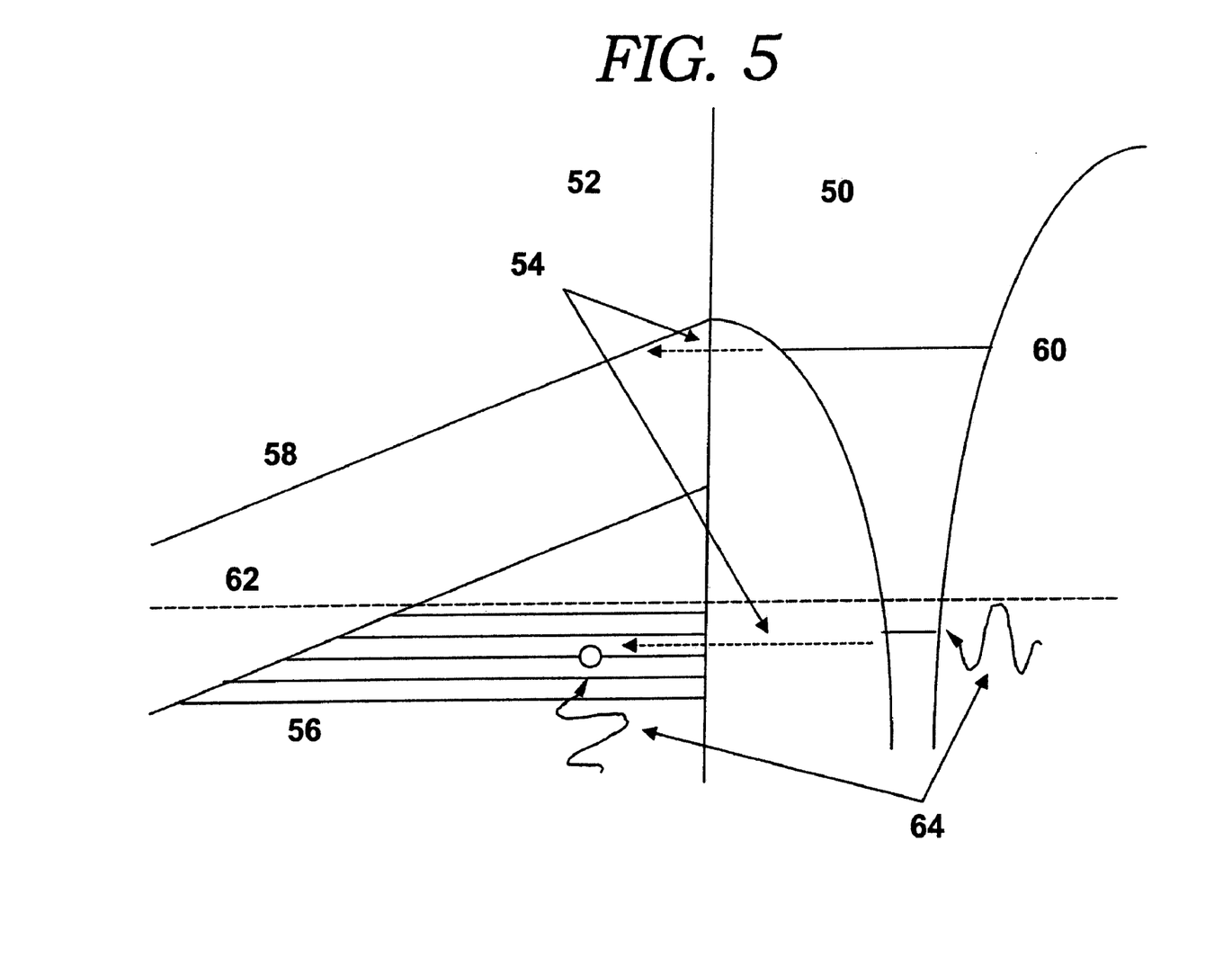
FIG. 5 shows the representative electronic energy level diagram of an extended atom at the tip surface.

As described, by utilizing the enhanced semiconductor and dielectric material absorptions in the UV, the onset of field evaporation becomes more rapid, occurring at significantly reduced electric fields. Due to this enhanced absorption, it is also possible to realize a photo ionization mechanism, wherein the laser stimulates electronic transitions from the more extended surface atoms, thereby freeing the ion. In photo-ionization, the field induced extension of atoms on the tip is still needed so that the final ionic state is escape (Tsong, 1978). FIG. 5 shows a representative electronic energy level diagram of an extended atom 50 at the semiconductor surface 52. As noted, the electric field tilts the semiconductor bandstructure such that tunneling 54 from the valence band 56 to the conduction band 58 occurs. The Fermi layer is shown at 62. This depletes the valence band population density near the surface. Likewise, tunneling from the extended surface atom to the conduction band occurs, depleting the electronic charge near atom. Thus the extended atom becomes polarized (Forbes, 1995). The photo-ionization 64 of such an extended surface atom may proceed via several "channels." The simplest is the direct photo-ionization wherein the bound electronic charge of the extended surface atom is promoted to the conduction band of the semiconductor or dielectric tip. Another is photo-dissociation, wherein the extended atom is promoted to an excited state 60, followed by tunneling of the electron to the conduction band. Photo-ionization may also proceed via valence to conduction band transitions occurring near the tip surface (Tsong, 1978; Tsong, 1976). The total photo-ionization rate may be represented as a sum over individual channels, wherein quantum mechanical matrix elements describe the photo-induced transition from initial to final states (Yu and Cardona, 2001). Unfortunately, it is impractical to determine the exact form of the extended atomic states, and hence to calculate the cross-sections for photo-ionization of the extended surface atoms. However, since the extension of a surface atom of a semiconductor or dielectric is significantly reduced from that of a metal, and since the material absorption in semiconductors or dielectrics transitions to bulk within in one to two monolayers, the bonds of the extended states will remain similar to the bulk. Therefore, the absorption of the extended atoms may be approximated by the bulk absorption subject to a strong electric field, as described by the Franz-Keldysh effect.

It is possible to get an estimate of photo-ionization rates as follows. The absorption coefficient of semiconductor or dielectric materials becomes "bulk-like" within several atomic layers from the surface. Thus, for semiconductor or dielectric materials, the tip surface absorption may be well approximated by the bulk absorption. The photo-ionization rate then becomes $j=n_{PI} \alpha I$, where $\alpha$ is now the bulk absorption coefficient. The number of extended surface atoms which may be photo-ionized is sensitive to the semiconductor or dielectric material, to the doping level, and to the surface conditions. However, for given emission tip conditions, the surface atoms which are most likely to ionize through the field evaporation mechanism are identical to the atoms which are most likely to be photo-ionized. Thus, the total emission rate may be written:

$$j=n[k_{th}+\alpha I],$$

where n now refers to the number of atoms available for either field evaporation or photo-ionization. This observation provides the information to estimate the photo-ionization rate as follows. First note the average physical extension of the surface atoms is roughly proportional to the electric field at the surface (Forbes, 1995). In particular, the tip electric field may act to reversibly increase or decrease the extension of the surface atoms. As mentioned, in photo-ionization, the field induced extension of atoms on the tip is still needed so that the final ionic state is escape. However, the tip fields used to enable photo-ionization will be reduced by approximately one to two orders of magnitude from those used for field evaporation. Therefore, the number of atoms available for photo-ionization will be reduced by approximately one to two orders of magnitude from the number of surface atoms normally available for field evaporation. Since the number of atoms available for field evaporation is typically about 1% of the surface atoms, the number of atoms available for photo-ionization will be approximately 0.01–0.1% of the surface atoms. Now, the photo-absorption rate $\alpha I$ is commonly expressed in units of photons absorbed per unit volume per unit time. Therefore, it is convenient to express the number of surface atoms available for photo-ionization as a volume. This volume is just 0.01–0.1% of the tip surface monolayer volume. The volume of the tip surface monolayer is $2\pi R^2 \Delta R$, where R is the tip radius and $\Delta R$ is the monolayer thickness. Assuming a tip radius of 50 nanometers and a monolayer thickness of 2 angstroms, the tip monolayer volume is approximately $\pi \times 10^{-18}$ cm$^3$. The photo-ionization volume $\Delta V$ is then just 0.01% of this volume, or $\Delta V \approx \pi \times 10^{-22}$ cm$^3$. This provides the information needed to estimate the photo-ionization current in the laser stimulated atom probe. To illustrate, consider the exemplary silicon tip irradiated by the laser of 405 nm wavelength. The bulk optical absorption of silicon at 405 nanometers wavelength is approximately $8 \times 10^4$ W/cm$^2$. However, as discussed, this value will be enhanced to approximately $2.5 \times 10^5$ per centimeter or greater by the Franz-Keldysh effect. For an optical absorption of $\alpha=2.5\times10^5$ per centimeter and an intensity of $I=1\times10^5$ W/cm$^2$, a photo-absorption rate of approximately $5.1 \times 10^{28}$ photons per cm$^3$ per second is produced. The tip photo-ionization volume of $\Delta V \approx \pi \times 10^{-22}$ cm$^3$ will then provide a photo-ionization current of approximately $1.6 \times 10^7$ ions per second. The photo-ionization current rises linearly with intensity. Thus, if the intensity is increased to $I=1 \times 10^6$ W/cm$^2$, a photo-ionization current of approximately $1.6 \times 10^8$ ions per second is produced, commensurate with the atom probe operational currents. The linear behavior also contrasts with the threshold behavior seen for field evaporation, and implies that photo-ionization processes will dominate the field evaporation at lower intensities in the laser stimulated atom probe.

Figure 6:
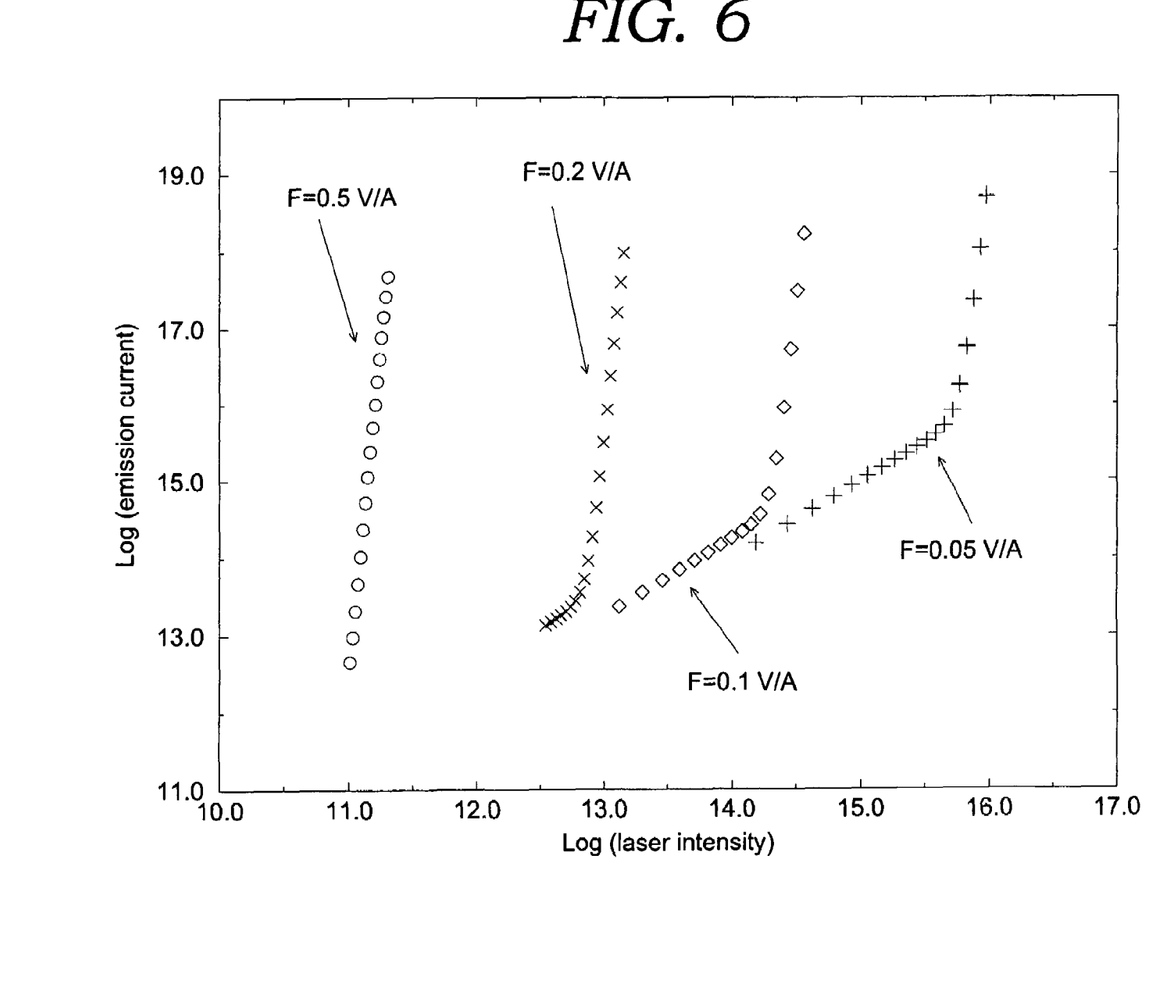
FIG. 6 contains calculated total emission rates, including the field evaporation and photo ionization rates, as a function of intensity, for constant tip electric field strengths of F=0.5V/A, F=0.2 V/A, F=0.1 V/A, and F=0.05 V/A.

To establish the effect of the presence of photo-ionization on the emission characteristics of the laser stimulated atom probe, recall the total emission current may be expressed in the form:

$$j \approx n_{FE} A \exp\{-C/F^2 \alpha I\} + \Delta V \alpha I,$$

where the first term describes field evaporation and the second term describes photo-ionization processes. As discussed, the absorption depends on the field F through the Franz-Keldysh effect, while the number of atoms available for either field evaporation or photo-ionization also depends on the field. However, to illustrate the effect of photo-ionization on the emission characteristics of the laser stimulated atom probe, these may be held constant. The emission characteristics of the laser stimulated atom probe are shown in FIG. 6, which contains calculated total emission rates as a function of intensity, for field emitter electric field strengths of F=0.5 V/A, F=0.2 V/A, F=0.1 V/A, and F=0.05 V/A. In these simulations, the number of surface atoms available for photo-ionization is taken to be approximately $4 \times 10^{-4}$% of the surface atoms, corresponding to a case of relatively poor photo-ionization wherein the silicon tip is undoped and/or contaminated with an oxidation layer. FIG. 6 shows the natural logarithm of the emission current, for each of these field strengths, versus the natural logarithm of the intensity. The emission current is plotted over the range of approximately $3\times10^5$ to $1\times10^8$ ions per second, while the intensity ranges from approximately $6\times10^4$ to $1\times10^7$ W/cm$^2$. The total ionization current transitions from the sharply increasing Arrhenius rate behavior seen at F=0.5 V/A, to an Arrhenius rate supplemented by the linear photo-ionization contribution at fields of F=0.2 V/A, and below. This is evidenced by the sharp break in the slope of the total emission seen for field values below F=0.2 V/A. In particular, in the linear portion of these ionization curves the photo-ionization mechanism is dominant. This shows the fundamental emission characteristics of the laser stimulated atom probe technique described herein.

As described, by utilizing the enhanced semiconductor and dielectric material absorptions in the UV, the onset of field evaporation becomes more rapid, shifting to significantly reduced electric fields. In addition, the optical absorption is further enhanced by a field induced redshift increase of the optical absorption at the tip. Due to the enhanced absorption, it is also possible to realize a photo ionization mechanism, wherein the laser stimulates electronic transitions from the more extended surface atoms, thereby freeing the surface ion (Tsong, et al). In particular, by selecting a wavelength in the UV where the optical absorption of semiconductor and dielectric materials is large, the field evaporation and photon ionization rates are simultaneously enhanced. In the laser stimulated approach, the tip field F is held effectively static during the laser pulse. Although the atom probe hardware is similar or identical to conventional atom probe implementations, the operating voltages are significantly reduced. Instead of operation at the 1–5 volt per angstrom level, tip fields are operated in the 0.05–0.5 V/A range. In this scenario, the static field still extends the more isolated surface atoms, but not as dramatically as in the case of metals. The field is also not required to be at the field evaporation threshold. Thus, the thermal energy from the laser pulse does not necessarily raise the field evaporation rate to appreciable levels. Instead, the static field enhances the optical absorption of the semiconductor and the laser photo ionizes the extended surface atom. Thus, previously negligible photo-ionization processes occurring at the surface of the emission tip become important. In this case the current will be linearly proportional to the laser intensity, as shown in FIG. 6. The strong optical absorption dependence on tip apex field also has a crucial smoothing effect on surface protrusions, since any protrusion will attain a local electric field enhancement proportional to the inverse square of the protrusion radius. As such, surface protrusions act as preferential optical absorbers, increasing the local photo-ionization rate. This is particularly effective when using photo-ionization for imaging molecular complexes such as viruses, proteins and organic molecules embedded in a sample tip. The lower required static electric field reduces the distortion of the complex as it protrudes from the tip surface. However, the increased relative static field due to the protrusion enhances the local absorption spectrum until photo-ionization is attained. Laser stimulated atom probe embodiments include any atom probe operation wherein the photo-ionization of surface atoms plays a significant role.

As to a further discussion of the manner of usage and operation of the laser stimulated atom probe, the same should be apparent from the above description. Accordingly, no further discussion relating to the manner of usage and operation will be provided.

With respect to the above description then, it is to be realized that the optimum dimensional relationships for the parts of the laser stimulated atom probe, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

Therefore, the foregoing is considered as illustrative only of the principles of the laser stimulated atom probe. Further, since numerous modifications and changes will readily occur to those skilled in the art, it is not desired to limit the exact construction and operation shown and described, and accordingly, all suitable modifications and equivalents may be resorted to, falling within the scope of the disclosure.

References Cited

| U.S. PATENT DOCUMENTS | | | |
| --- | --- | --- | --- |
| 5,440,124 | August 1995 | Kelly, et al. | 205/309 |
| 5,347,132 | September 1994 | Holzman, et al. | 250/389 |
| 5,061,850 | October 1991 | Kelly, et al. | 250/306 |

FOREIGN PATENT DOCUMENTS

EP 0 231 247 B1 1/1987 G. D. W. Smith and A. Cerezo

OTHER PUBLICATIONS

"Fundamentals of Semiconductors: Physics and Materials Properties, Third Edition," P. Y. Yu and M. Cardona, Springer-Verlag, Berlin Heidelberg, 2001.

"Performance of an energy-compensated three-dimensional atom probe," A. Cerezo, et al., Rev. Sci. Instrum. 69, 49–58 (1998).

"Development of a scanning atom probe," O. Nishikawa, et al., J. Vac. Sci. Technol. B 13, 599–602 (1995).

"Field evaporation theory: a review of basic ideas," R. G. Forbes, Appl. Surf. Sci 87, 1–11 (1995).

"Atom probe analysis and field emission studies of silicon," R. A. King, et al., J. Vac. Sci. Technol. B 12, 705–709 (1994).

"ATOM PROBE MICROANALYSIS: Principles and Applications to Materials Problems," M. K. Miller and G. D. W. Smith, Mater. Res. Soc., Pittsburgh, 1989.

"Application of position sensitive detector to atom probe microanalysis," A. Cerezo, T. J. Godfrey, and G. D. W. Smith, Rev. Sci. Instrum. 59, 862–866 (1988).

"Numerical calculation of the temperature distribution and evolution of the field-ion emitter under pulsed and continuous-wave laser irradiation," H. F. Liu and T. T. Tsong, J. Appl. Phys. 59, 1334–1340 (1986).

"Numerical calculation of the temperature evolution and profile of the field ion emitter in the pulsed-laser time-of-flight atom probe," H. F. Liu and T. T. Tsong, Rev. Sci. Instrum. 55, 1779–1784 (1984).

"Energy distributions of pulsed-laser field-desorbed gaseous ions and field-evaporated metal ions: A direct time-of-flight measurement," T. T. Tsong and T. J. Kinkus, Phys. Rev. B 29, 529–542 (1984).

"Pulsed-laser time-of-flight atom-probe field ion microscope," T. T. Tsong, S. B. McLane, and T. J. Kinkus, Rev. Sci. Instrum. 53, 1442–1448 (1982).

"Pulsed-laser atom-probe field-ion microscopy," G. L Kellogg and T. T. Tsong, J. Appl. Phys. 51, 1184–1193 (1980).

"FIELD-ION IMAGE FORMATION," T. T. Tsong, Surf. Sci. 70, 211–233 (1978).

"Photon stimulated field ionization," T. T. Tsong, J. H. Block, M. Nagasaka, and B. Viswanathan, J. Chem. Phys. 65, 2469 (1976).

"THE EFFECT OF A STRONG ELECTRIC FIELD ON THE OPTICAL PROPERTIES OF INSULATING CRYSTALS," L. V. Keldysh, Sov. Phys. JETP 7 (34), 788 (1958).

The invention claimed is:

1. A method for photo-ionizing atoms from a semiconductor or dielectric tip in an atom probe comprising the steps of:
   (a) providing a positive constant electric field from the tip to a negative electrode to extend atoms at the tip surface and to induce escape of surface atoms photo-ionized near the tip surface, wherein the magnitude of the electric field is held below the electric field required to produce thermal field evaporation of ions from the tip; and
   (b) providing a pulsed laser beam focused onto the tip to photo-ionize extended atoms on the tip, wherein the laser wavelength is selected to coincide with strong optical absorption in the semiconductor or dielectric tip material such that photo-ionization efficiency is enhanced, and wherein the thermal energy deposited by the laser into the tip is held less than the energy required to activate thermal field evaporation, thereby obtaining primarily non-thermal photo-ionization of atoms from a semiconductor or dielectric tip.

2. The method of claim 1, wherein the laser wavelength is selected to be from approximately 200 nanometers to approximately 475 nanometers in wavelength.

3. The method of claim 1, wherein the laser wavelength is selected near an optical absorption edge of the tip material, so as to provide a substantial enhancement of the optical absorption in the electric fields required to extend the surface atoms.

4. The method of claim 1, wherein the semiconductor or dielectric tip material is primarily silicon.

5. The method of claim 1, wherein the semiconductor or dielectric tip material is primarily silicon oxide, aluminum oxide, aluminum hafnium oxide, hafnium oxide, hafnium silicate, zirconium oxide, or zirconium silicate.

6. The method of claim 1, wherein the laser wavelength is from 370 nanometers to 440 nanometers wavelength.

7. The method of claim 1, wherein the laser pulse duration is about 1 nanosecond or less.

8. The method of claim 1, wherein the laser repetition rate is about 1 MHz or less.

9. The method of claim 1, wherein the field strength is about 0.2 volts per angstrom.

10. The method of claim 1, wherein the field strength is about 0.1 volts per angstrom.

11. The method of claim 1, wherein the field strength is about 0.05 volts per angstrom.

12. The method of claim 1, wherein the field strength is about 0.02 volts per angstrom.

13. The method of claim 1, wherein the field strength is about 0.01 volts per angstrom.

14. The method of claim 1, wherein the magnitude of the electric field is selected to be from about 10% to about 70% of the electric field required to produce field evaporation of ions from the tip.

15. The method of claim 1, wherein the magnitude of the electric field is selected to be from about 1% to about 10% of the electric field required to produce field evaporation of ions from the tip.

16. The method of claim 1, wherein the magnitude of the electric field is selected to be from about 0.1% to about 1% of the electric field required to produce field evaporation of ions from the tip.

17. The method of claim 1, wherein the magnitude of the electric field is selected to be about 0.1% of the electric field required to produce field evaporation of ions from the tip.

18. The method of claim 1, wherein the magnitude of the electric field is selected to be about 1% of the electric field required to produce field evaporation of ions from the tip.

19. The method of claim 1, wherein the magnitude of the electric field is selected to be about 10% of the electric field required to produce field evaporation of ions from the tip.

20. The method of claim 1, wherein the magnitude of the electric field is selected to be about 20% of the electric field required to produce field evaporation of ions from the tip.

21. The method of claim 1, wherein the magnitude of the electric field is selected to be about 50% of the electric field required to produce field evaporation of ions from the tip.

22. The method of claim 1, wherein the semiconductor or dielectric tip is a primarily silicon material; and wherein the method comprises the steps of:
   (a) providing a positive constant electric field from the primarily silicon tip to a negative electrode effective to extend atoms at the tip surface; and
   (b) providing a pulsed laser beam with a wavelength of about 405 nm, focused onto the tip, effective to provide an intensity of $10^5$ to $10^7$ Watts per square centimeter.

23. The method of claim 22, wherein the magnitude of the electric field is from about 0.05 to about 0.5 volts per angstrom.

24. The method of claim 22, wherein the laser pulse duration is about 1 nanosecond or less.

25. The method of claim 22, wherein the laser repetition rate is about 1 MHz or less.

26. A method for characterization of the ionization cross-section for atoms photo-ionized from a semiconductor or dielectric tip in an atom probe, the method comprising the steps of:
   (a) providing a semiconductor or dielectric emission tip adapted to have atoms photo-ionized from the tip surface;
   (b) providing a positive constant electric field from the tip to a negative electrode to extend atoms at the tip surface and to induce escape of surface atoms photo-ionized near the tip surface, wherein the magnitude of the electric field is held below the electric field required to produce thermal field evaporation of ions from the tip;
   (c) providing a pulsed laser beam focused onto the tip to photo-ionize extended atoms on the tip, wherein the laser wavelength is selected to be from approximately 200 nanometers to approximately 475 nanometers, and wherein the thermal energy deposited by the laser into the tip is held less than the energy required to activate thermal field evaporation, thereby obtaining primarily non-thermal photo-ionization of atoms from a semiconductor or dielectric tip;
   (d) recording the tip emitter current obtained from the application of steps (a)–(c);

(e) performing step (d) at a plurality of laser pulse intensities, so as to collect emission current information as a function of laser pulse intensity for said semiconductor or dielectric tip structure;

(f) analyzing the ionization cross-section for atoms photo-ionized from a semiconductor or dielectric tip by performing a fit to laser intensity according to the equation $j = n \times \Delta V \times \alpha \times I$, where n is the photo-ionization cross-section, j is the recorded emission current, $\Delta V$ is the tip surface monolayer volume, $\alpha$ is the tip bulk material absorption coefficient, and I is the laser pulse intensity.

27. A method for characterization of the ionization cross-section for atoms photo-ionized from a semiconductor or dielectric tip in an atom probe, the method comprising the steps of:

(a) providing a semiconductor or dielectric emission tip adapted to have atoms photo-ionized from the tip surface;

(b) providing a positive constant electric field from the tip to a negative electrode to extend atoms at the tip surface and to induce escape of surface atoms photo-ionized near the tip surface, wherein the magnitude of the electric field is held below the electric field required to produce thermal field evaporation of ions from the tip;

(c) providing a pulsed laser beam focused onto the tip to photo-ionize extended atoms on the tip, wherein the laser wavelength is selected to be from approximately 200 nanometers to approximately 475 nanometers, and wherein the thermal energy deposited by the laser pulse into the tip is held less than the energy required to activate thermal field evaporation, thereby obtaining primarily non-thermal photo-ionization of atoms from a semiconductor or dielectric tip;

(d) recording the tip emitter current obtained from the application of steps (a)–(c);

(e) performing step (d) at a plurality of tip electric field values, so as to collect emission current information as a function of tip electric field for said semiconductor or dielectric tip structure;

(f) analyzing the ionization cross-section for atoms photo-ionized from a semiconductor or dielectric tip by performing a fit to tip electric field according to the equation $j = n \times \Delta V \times \alpha \times I \times \exp\{-\beta/F\}$, where n is the photo-ionization cross-section, j is the recorded emission current, $\Delta V$ is the tip surface monolayer volume, $\alpha$ is the tip bulk material absorption coefficient, I is the laser pulse intensity, F is the tip electric field, and $\beta$ is a constant which depends on the optical properties of the tip material.

* * * * *